United States Patent
Wada et al.

(10) Patent No.: US 7,890,830 B1
(45) Date of Patent: Feb. 15, 2011

(54) TEST SIGNAL GENERATING APPARATUS

(75) Inventors: Takeshi Wada, Ebina (JP); Masahiko Dohi, Hadano (JP)

(73) Assignee: Anritsu Corporation, Atsugi-shi (JP)

( * ) Notice: Subject to any disclaimer, the term of this patent is extended or adjusted under 35 U.S.C. 154(b) by 232 days.

(21) Appl. No.: 12/281,751

(22) PCT Filed: Mar. 6, 2007

(86) PCT No.: PCT/JP2007/054284
§ 371 (c)(1),
(2), (4) Date: Oct. 22, 2008

(87) PCT Pub. No.: WO2007/102485
PCT Pub. Date: Sep. 13, 2007

(30) Foreign Application Priority Data

Mar. 6, 2006 (JP) ............................... 2006-059411

(51) Int. Cl.
*G01R 31/28* (2006.01)
(52) U.S. Cl. .................. 714/738; 714/715; 714/718; 714/720; 714/724; 714/728; 714/739
(58) Field of Classification Search .................. None
See application file for complete search history.

(56) References Cited

U.S. PATENT DOCUMENTS

| | | | |
|---|---|---|---|
| 6,223,318 B1* | 4/2001 | Yamashita et al. | 714/744 |
| 6,763,490 B1* | 7/2004 | Krech, Jr. et al. | 714/738 |
| 7,290,187 B2* | 10/2007 | Gottsche et al. | 714/724 |
| 7,363,566 B2* | 4/2008 | Goishi | 714/738 |
| 2006/0036389 A1* | 2/2006 | Ozora et al. | 702/108 |

FOREIGN PATENT DOCUMENTS

| JP | A 63-163181 | 7/1988 |
|---|---|---|
| JP | A 8-313602 | 11/1996 |
| JP | A 11-64469 | 3/1999 |
| JP | A 11-295398 | 10/1999 |
| JP | A 2005-127922 | 5/2005 |
| JP | A 2006-30090 | 2/2006 |

\* cited by examiner

*Primary Examiner*—John P Trimmings
(74) *Attorney, Agent, or Firm*—Greer, Burns & Crain, Ltd.

(57) ABSTRACT

The present invention is to provide a test signal generating apparatus which can generate a test signal for testing a device that dynamically change its operational state in response to a signal or the like. The test signal generating apparatus includes: a pattern storage unit 20 having patterns; a pattern selecting unit 23 for selecting a pattern from among the patterns; a test signal generating unit 25 for generating a test signal having a pattern selected by the pattern selecting unit 23, a trigger signal receiving unit 21 for receiving at least one trigger signal, and a pattern map storage unit 22 having a pattern map defining the number of repetitions for each pattern and a pattern corresponding to a test signal to be generated by the test signal generating unit after the test signal generating unit repeats the test signal on the basis of the number of repetitions.

4 Claims, 6 Drawing Sheets

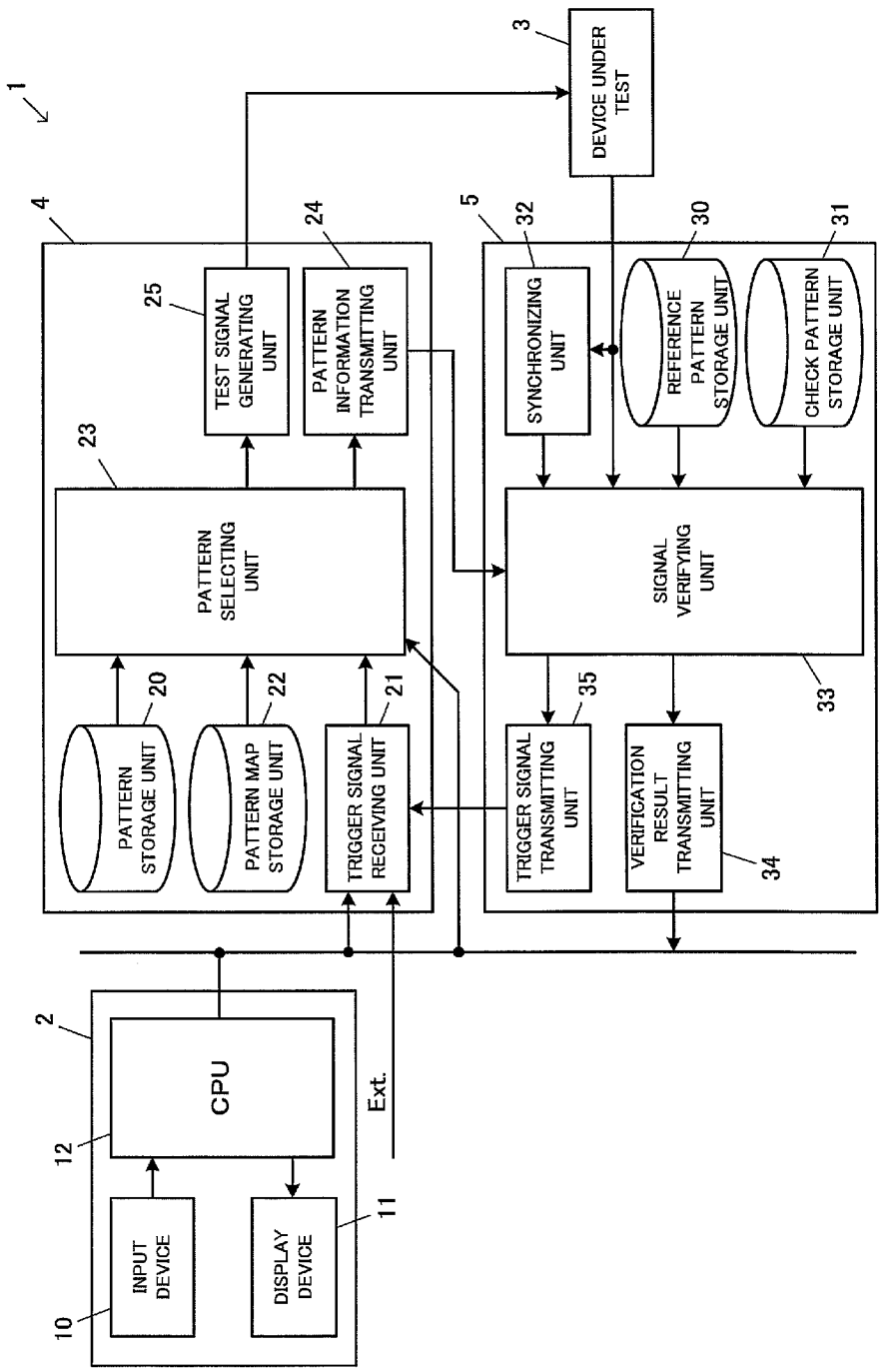

FIG. 2a

| PAT # | Pattrn | Length |
|---|---|---|
| 1 | 00 2D 20 46 72 69 20 4A | 64 |
| 2 | 00 34 20 31 35 33 34 3A | 64 |
| 3 | 0A 58 2D 4D 6F 7A 69 6C | 64 |
| 4 | 73 3A 20 30 30 30 38 0D | 64 |
| 5 | 6C 61 2D 53 74 61 74 75 | 64 |
| ... | | |
| 128 | | |

FIG. 2b

| PAT # | Loop | Block No. | Ext. | Manual | A | B |
|---|---|---|---|---|---|---|
| 1 | 5 | 2 | 5 | 4 | 5 | 0 |
| 2 | 10 | 3 | 0 | 0 | 3 | 1 |
| 3 | 50 | 4 | 0 | 4 | 4 | 4 |
| 4 | 3 | 5 | 1 | 1 | 5 | 0 |
| 5 | 100 | 6 | 2 | 3 | 1 | 0 |
| ... | | | | | | |
| 128 | | | | | | |

FIG. 4a

| PAT # | Pattern |
|---|---|
| 1 | 00 2D 20 46 72 69 20 4A |
| 2 | 00 34 20 31 35 33 34 3A |
| 3 | 0A 58 2D 4D 6F 7A 69 6C |
| 4 | 73 3A 20 30 30 30 38 0D |
| 5 | 6C 61 2D 53 74 61 74 75 |
| ⋮ | |
| 128 | |

FIG. 4b

| | Pattern |
|---|---|
| A | 2F 53 65 6E 74 0D 0A 58 |
| B | 79 2D 4B 65 79 3A 20 69 |

TEST SIGNAL GENERATING APPARATUS

This application is a U.S. National Phase under 35 U.S.C. §371, of International Application No. PCT/JP2007/054284, filed Mar. 6, 2007.

FIELD OF THE INVENTION

The present invention relates to a test signal generating apparatus, and more particularly to a test signal generating apparatus for generating a test signal to be used for testing a device.

BACKGROUND OF THE INVENTION

In a conventional test signal generating apparatus has pattern generating modules for generating patterns corresponding to test signals to be used for testing a device, a main sequencer is operative to have the pattern generating modules selectively generate patterns on the basis of a sequence program. Therefore, the conventional test signal generating apparatus can selectively generate test signals having patterns corresponding to various devices (see for example Patent Document 1).

Patent Document 1: Japanese Patent Laid-Open Publication No. H11-64469

DISCLOSURE OF THE INVENTION

Problems to be Solved by the Invention

The above-mentioned test signal generating apparatus cannot dynamically change patterns of test signals when the main sequencer is executing the sequence program. As a result, the above-mentioned test signal generating apparatus cannot generate a test signal for testing a device which dynamically change its operational state in response to a signal or the like.

It is, therefore, an object of the present invention to provide a test signal generating apparatus which can generate a test signal for testing a device which dynamically change its operational state in response to a signal or the like.

A test signal generating apparatus according to the present invention comprises: a test signal generating unit (25) for generating a test signal; a pattern storage unit (20) having patterns to be selected for the test signal; a pattern map storage unit (22) having a pattern map defining the number of repetitions for each pattern and a pattern corresponding to a test signal to be generated by the test signal generating unit after the test signal generating unit repeats the test signal on the basis of the number of repetitions; and a pattern selecting unit (23) for selecting, from among the patterns stored in the pattern storage unit (22), a pattern corresponding to a test signal to be generated by the test signal generating unit, wherein the test signal generating apparatus further comprises a trigger signal receiving unit (21) for receiving at least one trigger signal, the pattern map defines a pattern corresponding to the trigger signal, when the trigger signal is received by the trigger signal receiving unit under the condition that the test signal generating unit is repeatedly generating a test signal having a pattern selected by the pattern selecting unit on the basis of the number of repetitions defined by the pattern map, the pattern selecting unit selects a pattern corresponding to the trigger signal received by the trigger signal receiving unit on the basis of the pattern map.

The test signal generating apparatus according to the present invention can generate a test signal for testing a device which dynamically changes its operational state in response to a signal or the like, by reason that the pattern of the test signal is dynamically changed on the basis of the type of the trigger signal.

A device outputs a signal in response to the test signal, while a signal verifying apparatus verifies the signal received from the device. The test signal generating apparatus according to the present invention may be operative to receive, as a trigger signal, a verification result from the signal verifying apparatus.

The test signal generating apparatus according to the present invention can dynamically change a pattern of a test signal to be output to the device in response to a verification result from the signal verifying apparatus.

A device test system according to the present invention comprises: a test signal generating apparatus for generating a test signal to be transmitted to a device (3) to be tested, the device outputting a signal in response to the test signal; and a signal verifying apparatus for verifying the signal received from the device, the test signal generating apparatus comprising: a test signal generating unit (25) for generating a test signal; a pattern storage unit (20) having patterns to be selected for the test signal; a pattern map storage unit (22) having a pattern map defining the number of repetitions for each pattern and a pattern corresponding to a test signal to be generated by the test signal generating unit after the test signal generating unit repeats the test signal on the basis of the number of repetitions; and a pattern selecting unit (23) for selecting, from among the patterns stored in the pattern storage unit (22), a pattern corresponding to a test signal to be generated by the test signal generating unit, the signal verifying apparatus comprising a reference pattern storage unit (30) having reference patterns corresponding to the respective patterns, wherein the test signal generating apparatus further comprises a trigger signal receiving unit (21) for receiving at least one trigger signal, and a pattern information transmitting unit (24) for transmitting pattern information indicative of the pattern selected by the pattern selecting unit, the signal verifying apparatus further comprises a signal verifying unit (33) for verifying, on the basis of a reference pattern corresponding to a pattern represented by the pattern information transmitted from the pattern information transmitting unit, the signal received from the device, the pattern map defines a pattern corresponding to the trigger signal, when the trigger signal is received by the trigger signal receiving unit under the condition that the test signal generating unit is repeatedly generating a test signal having a pattern selected by the pattern selecting unit on the basis of the number of repetitions defined by the pattern map, the pattern selecting unit selects a pattern corresponding to the trigger signal received by the trigger signal receiving unit on the basis of the pattern map.

The device test system according to the present invention can test a device which dynamically changes its operational state in response to a signal or the like, by reason that the pattern of the test signal is dynamically changed on the basis of the type of the trigger signal.

In the device test system according to the present invention, the signal verifying apparatus may further comprise a trigger signal transmitting unit (35) for selectively transmitting at least two different trigger signals including a trigger signal corresponding to a condition that the signal verifying unit detects code error from the signal received from the device, and a trigger signal corresponding to a condition that the signal verifying unit determines that the signal received from the device is partly coincident with at least one reference pattern.

The device test system according to the present invention can change a test signal to be generated by the test signal generating apparatus on the basis of the type of the verification result.

A test signal generating program according to the present invention has a test signal generating apparatus generate a test signal for testing a device, wherein the test signal generating program designates the number of repetitions corresponding to a pattern selected from among patterns previously stored in the test signal generating apparatus, and two different operations, one operation which depends on the type of a trigger signal and is performed by the test signal generating apparatus in response to the trigger signal received under the condition that the test signal generating apparatus is generating a test signal having the pattern on the basis of the number of repetitions, and another operation to be performed by the test signal generating apparatus after generating a test signal having said pattern on the basis of said number of repetitions, when said trigger signal is not received by said trigger signal receiving apparatus under the condition that said test signal generating apparatus is generating a test signal having said pattern on the basis of said number of repetitions.

The test signal generating program according to the present invention can have the test signal generating apparatus generate a test signal for testing a device which dynamically change its operational state in response to a signal or the like, by reason that the pattern of the test signal is dynamically changed on the basis of the type of the trigger signal.

ADVANTAGEOUS EFFECT OF THE INVENTION

The present invention is to provide a test signal generating apparatus which can generate a test signal for testing a device which dynamically change its operational state in response to the test signal or the like.

BRIEF DESCRIPTION OF THE DRAWINGS

FIG. 1 is a block diagram showing a device test system according to one preferred embodiment of the present invention.

FIGS. 2a and 2b are schematic diagrams showing examples of patterns and pattern map stored in a test signal generating apparatus forming part of the device test system according to the preferred embodiment of the present invention.

FIG. 4a and 4b are schematic diagrams showing examples of reference patterns and check patterns stored in the signal verifying apparatus forming part of the device test system according to the preferred embodiment of the present invention.

EXPLANATION OF THE REFERENCE NUMERALS

Figure 3:
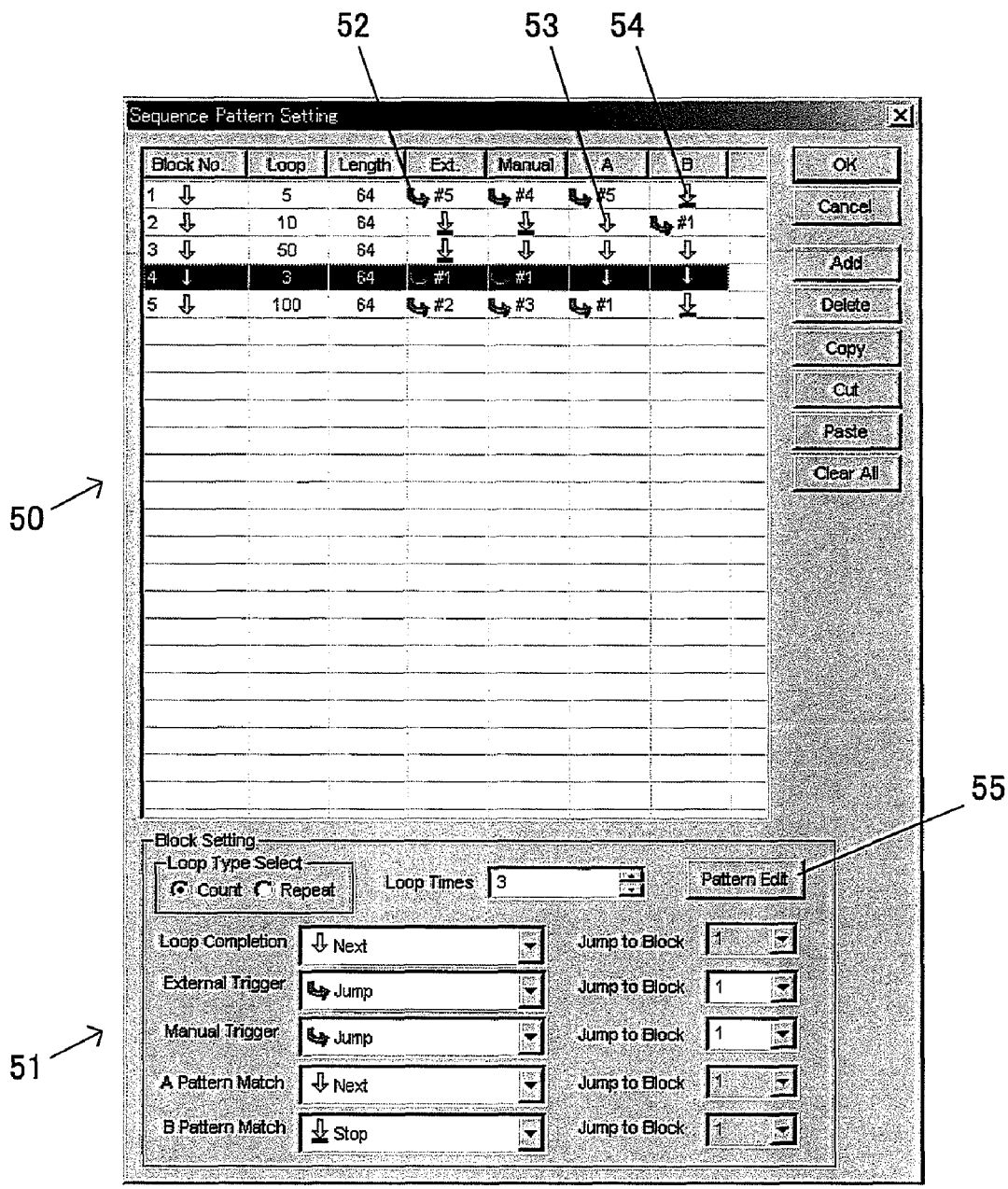
FIG. 3 is an image showing an edit screen of the patterns and pattern map displayed on the display device forming part of the device test system according to the preferred embodiment of the present invention.

1: device test system
2: input/output apparatus
3: device under test
4: test signal generating apparatus
5: signal verifying apparatus
10: input device
11: display device
12: CPU
20: pattern storage unit
21: trigger signal receiving unit
22: pattern map storage unit
23: pattern selecting unit
24: pattern information transmitting unit
25: test signal generating unit
30: reference pattern storage unit
31: check pattern storage unit
32: synchronizing unit
33: signal verifying unit
34: verification result transmitting unit
35: trigger signal transmitting unit

PREFERRED EMBODIMENT OF THE INVENTION

One preferred embodiment of the test signal generating apparatus according to the present invention will be described hereinafter with reference to the drawings.

FIG. 1 is a block diagram showing the test signal generating apparatus according to the preferred embodiment of the present invention.

As shown in FIG. 1, the device test system 1 comprises an input/output apparatus 2, a test signal generating apparatus 4 for generating test signals to be used for testing a device 3 under test, and a signal verifying apparatus 5 for verifying a signal from the device 3 under test.

The input/output apparatus 2 has an input unit 10 such as for example key board, pointing device and the like, a display unit 11, and a central processing unit (CPU) 12 for executing a program to control the device test system 1. Here, the input/output apparatus 2 may be constituted by an external computer device.

The test signal generating apparatus 4 comprises a pattern storage unit 20 having patterns, a trigger signal receiving unit 21 for receiving a trigger signal, a pattern map storage unit 22 having a pattern map, a pattern selecting unit 23 for selecting a pattern from among the patterns stored in the pattern storage unit 20 on the basis of the pattern map stored in the pattern map storage unit 22 and the type of the trigger signal received by the trigger signal receiving unit 21, a pattern information transmitting unit 24 for transmitting pattern information on the pattern selected by the pattern selecting unit 23 to the signal verifying apparatus 5, and a test signal generating unit 25 for generating a test signal having a pattern selected by the pattern selecting unit 23. The pattern map indicates the number of repetitions for each pattern to ensure that a test signal having a selected pattern is repeatedly generated by the test signal generating unit 25 on the basis of the number of repetitions corresponding to the selected pattern. The pattern map further indicates operations corresponding to respective types of trigger signals to be selectively received by the trigger signal receiving unit 21. When the trigger signal receiving unit 21 receives at least one trigger signal under the condition that the test signal generating unit 25 is repeatedly generating a test signal having a selected pattern, the operation corresponding to the type of the trigger signal received by the trigger signal receiving unit 21 is performed by the pattern selecting unit 23. The pattern map further indicates an operation to be performed by the pattern selecting unit 23 in the event that the trigger signal receiving unit 21 fails to receive a trigger signal under the condition that the test signal generating unit 25 is repeatedly generating a test signal having a selected pattern.

The pattern storage unit 20 is constituted by a storage medium such as for example random access memory (RAM). As shown in FIG. 2(a), the pattern storage unit 20 has a plurality of patterns to be used for testing the device 3 under test. In this embodiment, the pattern storage unit 20 has one hundred and twenty eight patterns. However, the number of the patterns stored in the pattern storage unit 20 is not limited to 128 in the present invention. Here, the parameter "Length" is intended to indicate a length of a pattern to be selected from the pattern storage unit 20. The pattern storage unit 20 may have redundant patterns.

In FIG. 1, the trigger signal receiving unit 21 is operative to receive trigger signals from the input/output apparatus 2, the device 3 under test, the signal verifying apparatus 5 and the like. Here, the trigger signals includes an external input signal (Ext.), a signal inputted into the input/output apparatus 2 in response to user's operation (Manual), a detection (A, B) of each check pattern for pattern matching previously set by the signal verifying apparatus 5, and a detection of an error from a signal received from the device 3 under test.

The external input signal is intended to indicate a trigger signal based on a status of relations of the device 3 under test and the signal verifying apparatus 5 with respect to the test signal generating apparatus 4, for example, a change of an operation state of the device 3 under test, and a verification result of a signal received from the device 3 under test by the signal verifying apparatus 5.

In this embodiment, the trigger signal receiving unit 21, the pattern selecting unit 23, the pattern information transmitting unit 24, and the test signal generating unit 25 are collectively constituted by a field programmable gate array (FPGA).

The pattern map storage unit 22 is constituted by a storage medium such as for example a random access memory (RAM), and has pattern map shown in, for example, FIG. 2(b). The pattern map constitutes a test signal generating program to be executed by the test signal generating apparatus 4, and designate a pattern of a test signal to be generated by the test signal generating unit 25 on the basis of the type of trigger signal.

Here, "Loop" parameter shown in FIG. 2(b) is intended to indicate the number of repetitions, in order to allow the test signal generating unit 25 to repeatedly generate, on the basis of the number of repetitions, the test signal having a selected pattern. When, for example, "Loop" parameter corresponding to the pattern #1 is numeral "5", the test signal generating unit 25 generates a test signal having a pattern corresponding to the pattern #1 five times.

"Block No." parameter is intended to indicate the next action to be performed when the test signal generating unit 25 completes the repetitive generation of the test signal on the basis of the number of repetitions set as "Loop" parameter without receiving a trigger signal.

"Ext." parameter is intended to indicate the next action to be performed when an external trigger signal is received before the test signal generating unit 25 completes a repetition of a test signal based on the "Loop" parameter.

"Manual" parameter is intended to indicate the next action to be performed when a trigger signal inputted in response to user's operation is received before the test signal generating unit 25 completes the repetitive generation of a test signal based on the "Loop" parameter.

"A" and "B" parameters are intended to define the next action to be performed when a trigger signal on a detection of each check pattern is received before the test signal generating unit 25 completes a repetition of a test signal based on the "Loop" parameter.

Each of the parameters "Block No.", "Ext.", "Manual", "A" and "B" is intended to indicate an index number corresponding to a pattern of a test signal to be generated by the test signal generating unit 25 after generating a test signal having a selected pattern. Here, an index number "0" indicates that each sign of a pattern of a test signal to be generated by the test signal generating unit 25 is zero. In other words, this means that the test signal generating unit 25 stops generating a test signal.

In this embodiment, the patterns and the pattern map are configured through the input/output apparatus 2. FIG. 3 is an image showing an edit screen to be displayed on the display unit 11 by the CPU 12 of the input/output apparatus 2.

On the edit screen, the user can select a pattern from the list 50 through the input unit 10, and define parameters of the selected pattern through controllers arranged in the edit area 51.

In FIG. 3, "Loop Completion" defined in the edit area 51 of the edit screen is used for setting "Block No." parameter indicating the next action to be performed when the test signal generating unit 25 completes the repetitive generation of the test signal on the basis of the number of repetitions set as "Loop" parameter without receiving a trigger signal.

Each of down-pointing arrows defined in the column "Block No." is used for having the test signal generating unit generate a test signal having a pattern corresponding to the next index number below the current index number after repeating a test signal having a pattern corresponding to the current index number on the basis of the number of repetitions designated in the column "Loop". A curved down-pointing arrow 52 for indicating the next pattern or a down-pointing arrow 54 shown with a regulated line may be set to this column, and will be described hereinafter.

The following description is directed to the columns "Ext.", "Manual", "A", and "B" to be used for defining the next action (such as pattern generating operation and stop operation) to be performed when the trigger signal receiving unit 21 receives a trigger signal under the condition that the test signal generating unit 25 is repeatedly generating a test signal having a selected pattern.

Here, a numeral shown with the curved down-pointing arrow 52 in a table 50 is intended to indicate an index number corresponding to the pattern of the next test signal to be generated by the test signal generating unit 25. When, for example, the external trigger (Ext.) is received under the condition that the test signal generating unit 25 is generating, five times, a test signal having a pattern represented by pattern #1 on the basis of the number of repetitions designated in the column "Loop", the test signal generating unit 25 generates a test signal having a pattern represented by pattern #5 as shown in FIG. 3.

The down-pointing arrow 53 is intended to indicate a pattern corresponding to an index number of a test signal next to a test signal which is being currently generated and outputted by the test signal generating unit 25, under the condition that a trigger signal is received when the test signal is being currently generated and outputted by the test signal generating unit 25. When, for example, a trigger signal on a detection (A) of a check pattern is received under the condition that the test signal generating unit 25 is generating a test signal having a pattern represented by pattern #2 ten times, the test signal generating unit 25 generates the next test signal having a pattern represented by pattern #3 after finishing the generation of the current test signal having the pattern represented by pattern #2.

When, for example, a trigger signal on a detection (A) of a check pattern is detected by the trigger signal receiving unit 21 at the time of receiving the 50th bit of the pattern (length: 64 bits in FIG. 3) of the 7th round of test signal, the test signal generating unit 25 transmits the 51th to 64th bits of the pattern of the 7th round of test signal to the device 3 under test, does not transmit the remaining test signals, i.e., the 8th, 9th, and 10th round of test signals to the device 3 under test, and start to generate a test signal having a pattern corresponding to the pattern #3.

The down-pointing arrow 54 shown with a regulated line is used for having the test signal generating unit 25 stop to generate a test signal. When, for example, a trigger signal on a detection (B) of a check pattern is detected by the trigger signal receiving unit 21 under the condition that the test signal generating unit 25 is generating five times a test signal having a pattern corresponding to the pattern #1, the test signal generating unit 25 stops generating the test signal in FIG. 3.

Each of the patterns is edited on an edit screen (not shown) which is displayed in response to the action of the pattern edit button 55.

As shown in FIG. 1, the pattern selecting unit 23 is operative to select one pattern from among patterns stored in the pattern storage unit 20.

When the trigger signal receiving unit 21 receives a trigger signal under the condition that the test signal generating unit 25 is repeatedly generating a test signal having a selected pattern, or when the test signal generating unit 25 completes a repetitive generation of a test signal having a selected pattern, the pattern selecting unit 23 stops generating a test signal.

When one of the patterns is selected by the pattern selecting unit 23, the pattern information transmitting unit 24 transmits, to the signal verifying apparatus 5, pattern information indicative of the pattern selected by the pattern selecting unit 23.

The signal verifying apparatus 5 comprises a reference pattern storage unit 30 having a plurality of reference patterns stored therein, a check pattern storage unit 31 having a plurality of check patterns stored therein, a synchronizing unit 32 for synchronizing the device 3 under test, a signal verifying unit 33 for verifying the signal received from the device 3 under test on the basis of the check patterns and the reference pattern corresponding to the pattern represented by the pattern information transmitted by the pattern information transmitting unit 24, a verification result transmitting unit 34 for transmitting the verification result obtained by the signal verifying unit 33 to the CPU 12, and a trigger signal transmitting unit 35 for transmitting, as a trigger signal, a signal indicative of the verification result obtained by the signal verifying unit 33 to the trigger signal receiving unit 21.

The reference pattern storage unit 30 is constituted by a storage medium such as for example a random access memory (RAM), and has a plurality of reference patterns corresponding to the respective patterns stored in the pattern storage unit 20 as shown in FIG. 4(a).

The check pattern storage unit 31 is constituted by a storage medium such as for example a random access memory (RAM), and has a plurality of check patterns for pattern matching with the pattern of the signal received from the device 3 under test as shown in FIG. 4(b).

In this embodiment, the check pattern storage unit 31 has two check patterns A and B. The present invention does not limit the number of the check patterns stored in the check pattern storage unit 31. The reference patterns and the check patterns are set through the input/output apparatus 2.

In FIG. 1, the synchronizing unit 32 is operative to detect the phase of the signal received from the device 3 under test, and to adjust, on the basis of the detected phase, the timing of the verification to be performed by the signal verifying unit 33. In this embodiment, the synchronizing unit 32, the signal verifying unit 33, the verification result transmitting unit 34, and the trigger signal transmitting unit 35 are collectively constituted by a field programmable gate array (FPGA).

The signal verifying unit 33 is operative to compare the reference pattern represented by the pattern information received from the pattern information transmitting unit 24 with the pattern of the signal received from the device 3 under test, and attain the verification of the signal from the device 3 under test.

The signal verifying unit 33 is operative to perform the verification of the pattern matching by comparing each of the check patterns stored in the check pattern storage unit 31 with a pattern of the signal from the device 3 under test.

The verification result transmitting unit 34 is operative to transmit, to the CPU 12, the verification result of error rate or the like of the signal outputted from the device 3 under test on the basis of the comparison between each of the check patterns and the pattern of the signal from the device 3 under test. The verification result is received by the CPU 12, then displayed by the display unit 11.

When the signal verifying unit 33 makes a determination that the pattern of the test signal corresponds to the check pattern, the trigger signal transmitting unit 35 transmits a trigger signal to the trigger signal receiving unit 21, the trigger signal being indicative of the detection of the check pattern.

Additionally, the trigger signal to be transmitted by the trigger signal transmitting unit 35 may indicate an analysis result such as for example a judgment on whether or not an error rate of the test signal reaches a threshold level on the basis of the comparison between the check pattern and the pattern of the test signal, or an error detection.

The operation of the device test system 1 thus constructed will be then described hereinafter with reference to FIGS. 5 and 6.

Figure 5:
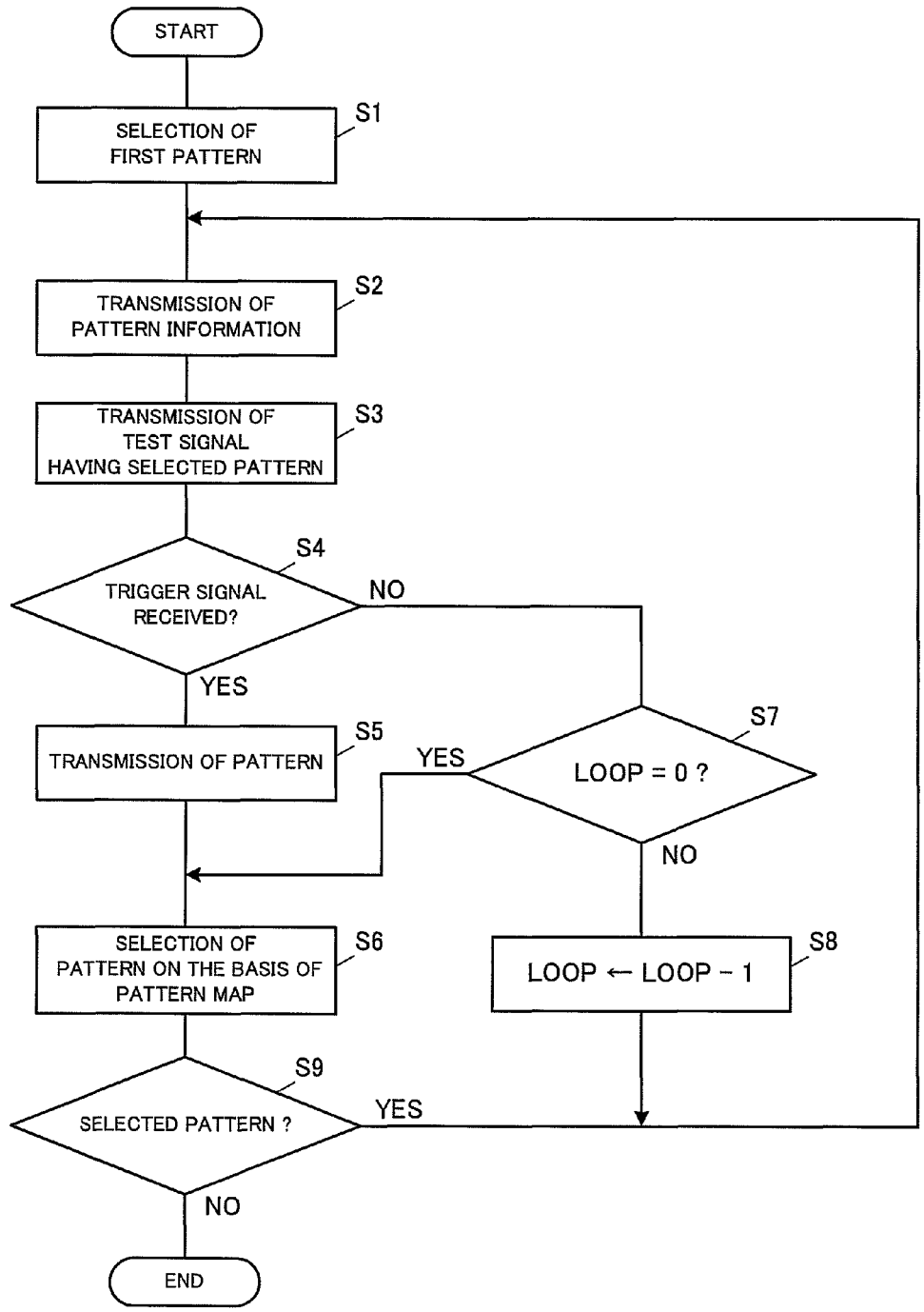
FIG. 5 is a flowchart showing an operation of a test signal generating apparatus forming part of the device test system according to the preferred embodiment of the present invention.

FIG. 5 is a flow chart showing the operation of the test signal generating apparatus 4.

The first pattern #1 is selected from among the ordered patterns stored in the pattern storage unit 20 by the pattern selecting unit 23 in response to a start-up instruction from the input/output apparatus 2 (in step S1).

The pattern information indicative of the first pattern #1 selected by the pattern selecting unit 23 is then transmitted to the signal verifying apparatus 5 by the pattern information transmitting unit 24 (in step S2). The test signal having the first pattern #1 selected by the pattern selecting unit 23 is then produced and transmitted by the test signal generating unit 25 to the device 3 under test (in step S3).

When a trigger signal based on the type of an external input (Ext.), a signal inputted into the input/output apparatus 2 on the basis of user's operation (Manual), and a detection (A, B) of check pattern previously set in the signal verifying apparatus 5 and the like is received by the trigger signal receiving unit 21 (in step S4), the test signal generating unit 25 completes the generation of the test signal which is being outputted, after repeatedly generating the current test signal on the basis of the number of repetition (in step S5). The pattern selecting unit 23 select a pattern, on the pattern map, corresponding to the type of the trigger signal received by the trigger signal receiving unit 21 (in step S6).

The test signal generating unit 25 is repeatedly generate a test signal on the basis of the number of repetitions indicated by "Loop" parameter at maximum (in step S7 and S8). When a trigger signal is not detected by the trigger signal receiving unit 21 within this period of time, a pattern is selected by the pattern selecting unit 23 on the basis of the pattern map (in step S6).

When the pattern selected by the pattern selecting unit 23 is not detected (in step S9), the test signal generating apparatus 4 completes its operation. When, on the other hand, the pattern selected by the pattern selecting unit 23 is detected, the test signal generating apparatus 4 perform an operation corresponding to a newly selected pattern in step S2 and following steps.

Figure 6:
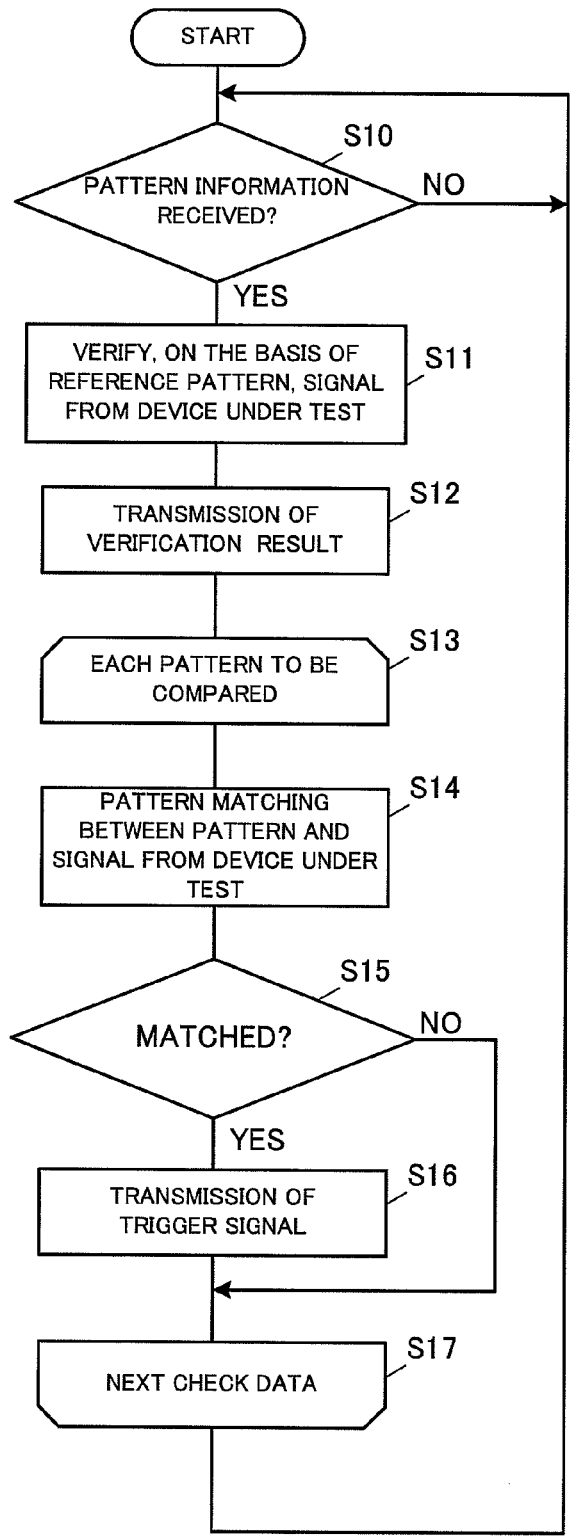
FIG. 6 is a flowchart showing an operation of a signal verifying apparatus forming part of the device test system according to the preferred embodiment of the present invention.

FIG. 6 is a flow chart showing the operation of the signal verifying apparatus 5.

The pattern information is firstly received by the signal verifying unit 33 from the pattern information transmitting unit 24 of the test signal generating apparatus 4 (in step S10). Then, the signal verifying unit 33 verifies a signal received from the device 3 under test by comparing a reference pattern corresponding to a pattern represented by the pattern information with a pattern of the signal received from the device 3 under test (in step S11). The verification result transmitting unit 34 transmits a verification result to the CPU 12 (in step S12).

Then, the signal verifying unit 33 performs a pattern matching of a check pattern and the pattern of the signal received from the device 3 under test (in step S14). When the determination is made (in step S15) that the check pattern is coincident with the pattern of the signal received from the device 3 under test, a trigger signal indicative of a detection of check pattern is transmitted to the trigger signal receiving unit 21 by the trigger signal transmitting unit 35 (in step S16). Here, the steps S14 to S16 are repeated on the basis of the number of repetitions (in step S13 and S17).

As shown in FIG. 6, a trigger signal may be produced when error is detected in step S11, or when error rate exceeds a predetermined threshold level. The pattern matching of plural predetermined check patterns and a pattern of a signal received from a device under test may be performed in parallel.

From the foregoing description, it will be understood that the device test system 1 according to one preferred embodiment of the present invention can test a device 3 under test which dynamically change its operational state in response to a signal or the like, by reason that the test signal generating apparatus 4 is operative to dynamically change the test signal on the basis of the type of the trigger signal.

The test signal generating apparatus 4 and the device test system 1 according to the present invention can test the device 3 under test with various jitters by performing, for example, phase modulation of a test signal while negotiating with the device 3 under test controlled on the basis of protocol, or accurately confirming a logical layer of the device 3 under test. Therefore, the device test system 1 according to the present invention can determine whether or not the error results from a logical layer or a physical layer.

In a personal computer complying with PCI Express in inner bus standard, a device such as a graphic card, Ethernet, the like is connected to a host device through upstream and downstream lines. As an example, the test signal generating apparatus 4 may be connected to the downstream line, the signal verifying apparatus 5 may be connected to the upstream line in place of the host device. In this case, the device test system 1 thus constructed can test a graphic card, Ethernet, or the like as a device 3 under test.

In this embodiment, the device 3 under test to be tested is represented by a relay device such as a router, a module forming part of the relay device, a semiconductor element forming part of the module. In the device test system, the test signal generating apparatus may be connected to an input terminal of an optical module designated as a device 3 under test through an electric to light conversion device, the signal verifying apparatus may be connected to an output terminal of the optical module through a light to electric conversion device.

In this embodiment, the patterns, the pattern map, the reference patterns, and the check patterns are set through the input device of the input/output apparatus 2. However, the input/output apparatus 2 may be operative to receive the patterns, the pattern map, the reference patterns, and the check patterns from a nonvolatile storage medium such as a hard disc, a detachable memory medium, or other memory medium connected through a network.

The invention claimed is:

1. A test signal generating apparatus comprising:
a test signal generating unit for generating a test signal;
a pattern storage unit having patterns to be selected for said test signal;
a pattern map storage unit having a pattern map defining the number of repetitions for each pattern and a pattern corresponding to a test signal to be generated by said test signal generating unit after said test signal generating unit repeats said test signal on the basis of said number of repetitions; and
a pattern selecting unit for selecting, from among said patterns stored in the pattern storage unit, a pattern corresponding to the test signal to be generated by said test signal generating unit, wherein
said test signal generating apparatus further comprises a trigger signal receiving unit for receiving at least one trigger signal,
said pattern map defines a pattern corresponding to said trigger signal,
when said trigger signal is received by said trigger signal receiving unit under the condition that said test signal generating unit is repeatedly generating a test signal having a pattern selected by said pattern selecting unit on the basis of said number of repetitions defined by said pattern map, said pattern selecting unit selects a pattern corresponding to said trigger signal received by said trigger signal receiving unit on the basis of said pattern map.

2. The test signal generating apparatus according to claim 1, wherein
when a device under test outputs a signal in response to said test signal, a signal verifying apparatus verifies said signal received from said device under test,
said trigger signal receiving unit receives, as a trigger signal, a verification result from said signal verifying apparatus.

3. A device test system comprising: a test signal generating apparatus for generating a test signal to be transmitted to a device under test, said device under test outputting a signal in response to said test signal; and a signal verifying apparatus for verifying said signal received from said device under test, said test signal generating apparatus comprising: a test signal generating unit for generating the test signal; a pattern storage unit having patterns to be selected for said test signal; a pattern map storage unit having a pattern map defining the number of repetitions for each pattern and a pattern corresponding to a test signal to be generated by said test signal generating unit after said test signal generating unit repeats said test signal on the basis of said number of repetitions; and a pattern selecting unit for selecting, from among said patterns stored in the pattern storage unit, a pattern corresponding to the test signal to be generated by said test signal generating unit, said signal verifying apparatus comprising a reference pattern storage unit having reference patterns corresponding to said patterns to be selected for said test signal, wherein said test signal generating apparatus further comprises a trigger signal receiving unit for receiving at least one trigger signal, and a pattern information transmitting unit for transmitting pattern information indicative of said pattern selected by said pattern selecting unit, said signal verifying apparatus further comprises a signal verifying unit for verifying, on the basis of a reference pattern corresponding to a pattern represented by said pattern information transmitted from said pattern information transmitting unit, said signal received from said device under test, said pattern map defines a pattern corresponding to said trigger signal, when said trigger signal is received by said trigger signal receiving unit under the condition that said test signal generating unit is repeatedly generating a test signal having a pattern selected by said pattern selecting unit on the basis of said number of repetitions defined by said pattern map, said pattern selecting unit selects a pattern corresponding to said trigger signal received by said trigger signal receiving unit on the basis of said pattern map.

4. The device test system according to claim 3, wherein said signal verifying apparatus further comprises a trigger signal transmitting unit for selectively transmitting at least two different trigger signals including a trigger signal corresponding to a condition that said signal verifying unit detects code error from said signal received from said device under test, and a trigger signal corresponding to a condition that said signal verifying unit determines that said signal received from said device under test is partly coincident with at least one reference pattern.

* * * * *